US010720906B2

(12) United States Patent
Jansen

(10) Patent No.: US 10,720,906 B2
(45) Date of Patent: Jul. 21, 2020

(54) VOLTAGE CONTROLLED OSCILLATOR WITH REDUCED PHASE NOISE

(71) Applicant: BAE Systems Information and Electronic Systems Integration Inc., Nashua, NH (US)

(72) Inventor: Douglas S. Jansen, Pelham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 168 days.

(21) Appl. No.: 16/029,118

(22) Filed: Jul. 6, 2018

(65) Prior Publication Data

US 2020/0014371 A1    Jan. 9, 2020

(51) Int. Cl.
*H03J 5/24*    (2006.01)
*H03L 7/081*    (2006.01)
(Continued)

(52) U.S. Cl.
CPC ............ *H03J 5/244* (2013.01); *H03B 5/1203* (2013.01); *H03B 5/1231* (2013.01); *H03B 5/36* (2013.01);
(Continued)

(58) Field of Classification Search
CPC ...... H03B 5/1228; H03B 5/1215; H03B 5/04; H03B 27/00; H03B 5/124; H03B 2200/0034; H03B 2200/0062; H03B 2200/0088; H03B 28/00; H03B 5/06; H03B 5/1203; H03B 5/1231; H03B 5/36; H03J 2200/36; H03J 5/244; H03L 7/081; H03L 7/087; H03L 7/099

(Continued)

(56) References Cited

U.S. PATENT DOCUMENTS 5,180,994 A    1/1993    Martin et al.
6,167,245 A    12/2000    Welland et al.
(Continued)

OTHER PUBLICATIONS

International Search Report, PCT/US19/38880, dated Sep. 23, 2019, 8 pages.

*Primary Examiner* — Arnold M Kinkead
(74) *Attorney, Agent, or Firm* — Finch & Maloney PLLC; Scott J. Asmus

(57) ABSTRACT

A voltage controlled oscillator (VCO) is disclosed to provide reduced phase noise at higher operating frequencies. A buffer-first VCO configured according to an embodiment includes multiple VCO core circuits configured to provide synchronously tuned oscillator signals. Each VCO core circuit is coupled to a summing node through a buffer circuit that generates uncorrelated phase noise such that the summing node provides a summation output of the oscillator signals with reduced phase noise. A multiplexer-less VCO configured according to an embodiment includes multiple buffer-first VCO circuits configured to provide oscillator signals covering a range of frequencies. Each buffer-first VCO circuit is controlled or selected by an enable signal. Buffer circuits are configured to select one of the buffer-first VCO circuits for coupling to a transmission line during a given time period based on the enable signal. The transmission line is terminated in a matched impedance at each end of the line.

20 Claims, 10 Drawing Sheets

(51) Int. Cl.
 *H03L 7/087* (2006.01)
 *H03L 7/183* (2006.01)
 *H03B 5/12* (2006.01)
 *H03B 5/36* (2006.01)
 *H03L 7/099* (2006.01)

(52) U.S. Cl.
 CPC .............. *H03L 7/081* (2013.01); *H03L 7/087* (2013.01); *H03L 7/099* (2013.01); *H03L 7/183* (2013.01); *H03J 2200/36* (2013.01)

(58) Field of Classification Search
 USPC ........... 331/132, 167, 2, 117 FE, 179, 46, 49
 See application file for complete search history.

(56) References Cited

U.S. PATENT DOCUMENTS

| | | | |
|---|---|---|---|
| 7,830,212 B2* | 11/2010 | Lee | ......................... H03L 7/085 |
| | | | 331/107 SL |
| 8,067,987 B2* | 11/2011 | Sen | ..................... H03B 5/1852 |
| | | | 327/156 |
| 2014/0120848 A1 | 5/2014 | Laskar | |
| 2016/0352341 A1 | 12/2016 | Hiebert et al. | |
| 2017/0047891 A1 | 2/2017 | Chen et al. | |

* cited by examiner

VOLTAGE CONTROLLED OSCILLATOR WITH REDUCED PHASE NOISE

STATEMENT OF GOVERNMENT INTEREST

This invention was made with United States Government assistance under Contract No. HR0011-15-C-0103 awarded by the Defense Advanced Research Projects Agency (DARPA). The United States Government has certain rights in this invention.

FIELD OF DISCLOSURE

The present disclosure relates to voltage controlled oscillators (VCOs), and more particularly, to VCOs configured to generate tuned oscillator signals with reduced phase noise.

BACKGROUND

Voltage controlled oscillators (VCOs) are devices that generate an oscillating signal at a desired frequency. Unfortunately, these devices typically produce a certain amount of phase noise or jitter in the output oscillator signal, which is undesirable in many applications. One approach to solving this problem is to combine the outputs of two or more synchronously tuned VCOs to reduce the phase noise. With this technique, however, when the combined outputs are fed to a buffer circuit to drive a transmission line, the buffer circuit can re-introduce additional phase noise and reduce any gains achieved through the use of multiple VCOs.

Another problem with VCOs is that they can generally only be tuned over a relatively narrow frequency range. Outside of this range, the phase noise performance can become unacceptably large. Thus, many VCO devices employ multiple VCOs, each designed to cover a portion of the desired tuning range, and the VCO outputs are fed through a multiplexer network to select the output of one the VCOs which is associated with the desired frequency. Here again however, the multiplexers typically introduce additional phase noise which can at least partially defeat the purpose of using multiple VCOs, with this approach.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts.

Figure 1:
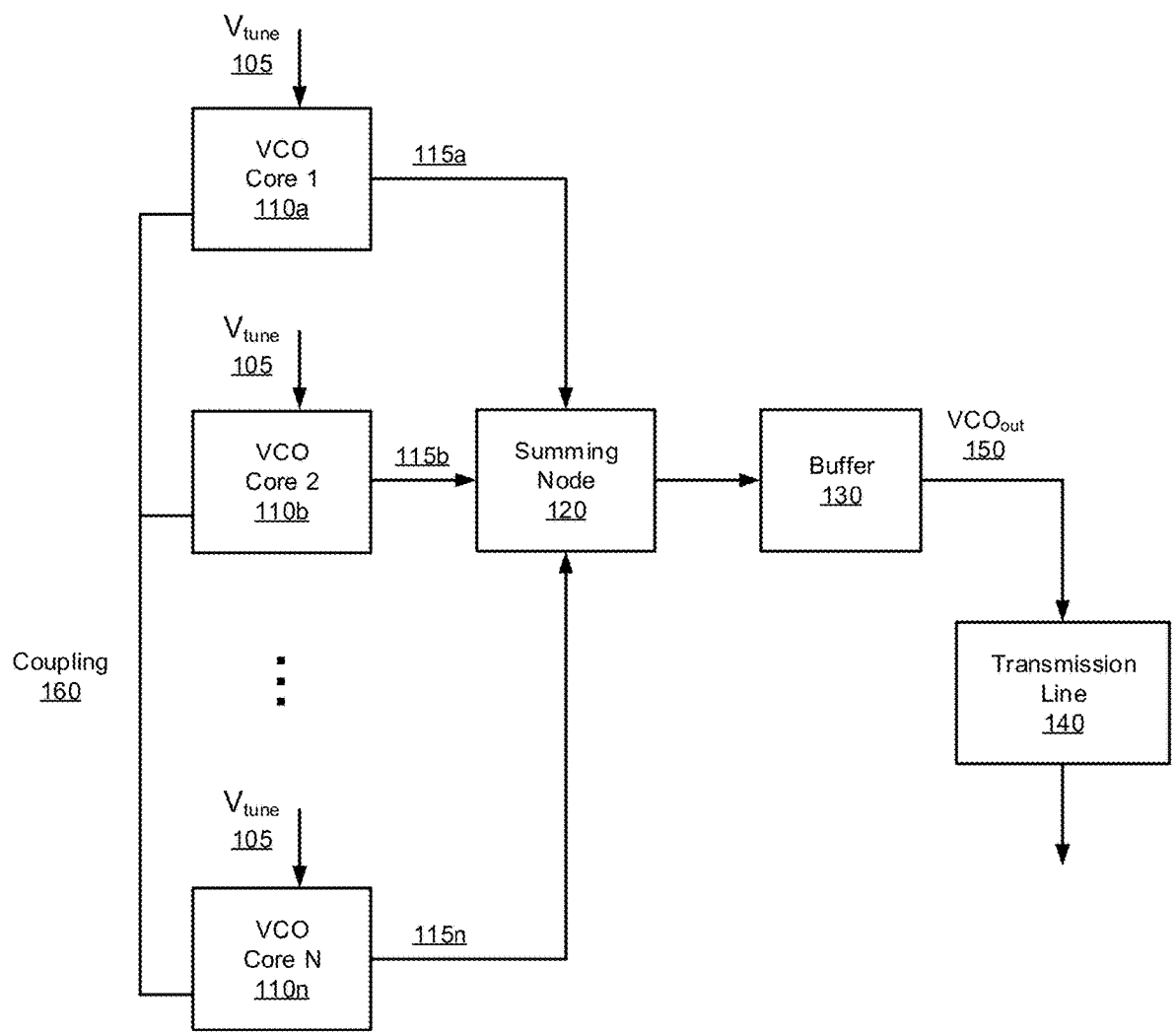
FIG. 1 is a circuit diagram of a VCO configuration susceptible to increased phase noise and the problems that flow therefrom.

Although the following Detailed Description will proceed with reference being made to illustrative embodiments, many alternatives, modifications, and variations thereof will be apparent to those skilled in the art.

DETAILED DESCRIPTION

Voltage controlled oscillators (VCOs) are disclosed which provide reduced phase noise, at higher operating frequencies. The improvement in phase noise floor at higher frequencies is particularly important in broadband millimeter wave systems. In one embodiment, the VCO is configured in a "buffer-first" configuration which comprises multiple VCO core circuits that are configured to be synchronously coupled and tuned to generate oscillator signals at the same frequency. The VCO core outputs are buffered and then summed to increase the signal strength relative to the phase noise, as will be explained in greater detail below.

In another embodiment, a multiplexer-less (MUXless) VCO configuration comprises multiple VCOs, which may be any combination of buffer-first VCOs (and/or single VCO core circuits with buffered outputs), that are each configured to generate an oscillator signal at a different frequency (within a relatively limited frequency range) and to be individually enabled so that a larger frequency range may be covered by the selection of any one these buffer-first VCOs or VCO cores. The various frequencies are selected to span a desired frequency range for the output of the MUXless VCO configuration. Each of the VCOs (buffer-first or single core) are coupled to a transmission line through a buffer circuit that is controlled by an enable signal, to allow for the selection of that VCO to provide the VCO output, as will also be explained in greater detail below. This configuration eliminates the need for a multiplexer tree network to select a desired VCO, which would otherwise introduce additional phase noise at each stage of the tree.

The disclosed VCOs can be employed, for example, in a communication or computing platform, including a receiver (demodulator) and/or a transmitter (modulator), as well as in analog-to-digital converters and digital-to-analog converters. Any number of other applications having a need for processing of millimeter wave signals with reduced phase noise will be apparent. In accordance with an embodiment, a buffer-first VCO includes multiple VCO core circuits configured to provide synchronously tuned oscillator signals. Each VCO core circuit is coupled to a summing node through a buffer circuit that generates uncorrelated phase noise such that the summing node provides a summation output of the oscillator signals with reduced phase noise. In accordance with another embodiment, a MUXless VCO includes multiple VCO circuits configured to provide oscillator signals covering a range of frequencies. Each VCO circuit can be a buffer-first VCO (or a single VCO core circuit coupled to a buffer) that is controlled or selected by an enable signal. The buffer circuits are configured to select one of the VCO circuits for coupling to a transmission line during a given time period. The transmission line is terminated in a matched impedance at each end of the line.

As will be appreciated in light of this disclosure, the VCO configurations described herein may allow for improved performance, compared to existing VCO circuits such as those which sum the outputs of VCO cores before buffering or those which employ multiplexer networks to select from one of many VCO cores. The disclosed VCOs may therefore be more suitable for use in a variety of applications such as high-performance radio receivers and transmitters, frequency synthesizers for electronic warfare (EW) systems, RF mixer circuits, digital to analog converters, analog to digital converters, and microwave communication systems, for example. The disclosed VCOs can be implemented on a broad range of platforms including radios, EW systems, data communication devices, smart phones, personal computers, laptop computers, tablets, and so forth.

FIG. 1 is a circuit diagram of a VCO configuration 100 susceptible to increased phase noise and the problems that flow therefrom, as will be explained herein. The VCO is shown to include a number of VCO cores 110a, . . . 110n, a summing node 120, and a buffer circuit 130. A transmission line 140 is also shown, coupled to the buffer circuit 130, to receive the oscillator signal $VCO_{out}$ 150 for distribution to consumers of the signal.

The VCO cores 110 are shown to be synchronously coupled and tuned to the frequency specified by Vtune signal 105, and are configured to generate oscillator signals 115a, . . . 115n at that frequency. The coupling may be accomplished through direct wiring 160, or through electromagnetic coupling, to ensure that all cores are locked to the same frequency and phase. The summing node 120 is configured to sum the oscillator signals 115 and provide the sum to the buffer circuit 130. Because the phase noise generated by the VCO cores is uncorrelated between the cores, it is possible to achieve up to 3 dB of phase noise improvement for every doubling of VCO cores in the summation. Buffer circuit 130 is configured to buffer the sum to generate the output signal $VCO_{out}$ 150 to drive the transmission line 140. The buffer circuit, however, introduces additional phase noise to the output which can partially or entirely reduce any gains achieved through the use of multiple VCOs.

Figure 2:
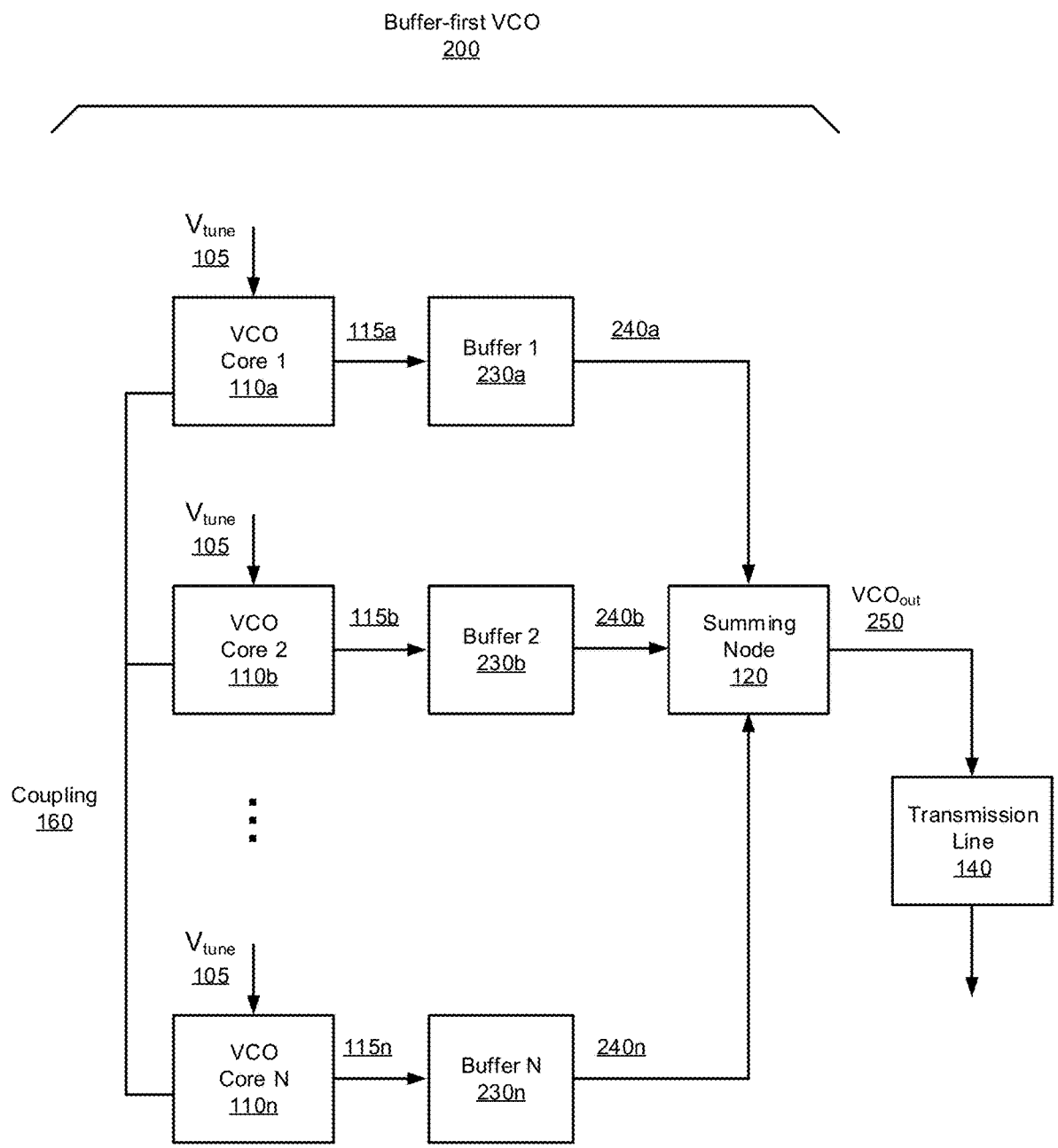
FIG. 2 is a circuit diagram of a buffer-first VCO, configured in accordance with certain embodiments of the present disclosure.

FIG. 2 is a circuit diagram of a buffer-first VCO 200, including a combination of pre-buffered VCO cores, configured in accordance with certain embodiments of the present disclosure. The VCO is shown to include a number of VCO cores 110a, . . . 110n, a number of buffer circuits 230a, . . . 230n, and a summing node 120. A transmission line 140 is also shown, coupled to the summing node 120, to receive the oscillator signal $VCO_{out}$ 250 for distribution to consumers of the signal. In some embodiments consumers of the VCO signal may include, for example, a radio frequency mixer circuit, a millimeter-wave analog-to-digital converter, and a millimeter-wave digital-to-analog converter, to name just a few.

The VCO cores 110 are shown to be synchronously coupled and tuned to the frequency specified by Vtune signal 105, and are configured to generate oscillator signals 115a, . . . 115n at that frequency. The coupling may be accomplished through direct wiring 160, or through electromagnetic coupling, to ensure that all cores are locked to the same frequency and phase. The buffer circuits 230 are coupled to the outputs of the VCO cores 110 and are configured to provide buffered oscillator signals 240a, . . . 240n as will be explained in greater detail below. The buffered oscillator signals 240a, . . . 240n each include a substantially identical oscillator signal with some level of additional phase noise generated by the buffer circuit. While the oscillator signal component is the same, the phase noise generated by each of the buffer circuits is uncorrelated with the phase noise generated by the other buffer circuits.

The summing node 120 is configured to sum the buffered oscillator signals 240a, . . . 240n to generate the VCO output signal 250. This summation increases the strength of the oscillator signal at twice the rate of the uncorrelated noise signal. For every doubling of the number of cores, there is theoretical limit of 3 dB gain in signal to noise ratio. The disclosed technique for buffering before summation allows for the realization of this 3 dB per doubling gain at large frequency offsets from the VCO frequency. In contrast, without buffering before summation, the achieved gain will be limited to less than 3 dB per doubling, since all VCO core outputs go through a single buffer which adds corrupting noise to the combined VCO signal. Thus, a reduction in the relative phase noise is achieved in the VCO output 250, using the disclosed techniques.

Figure 3:
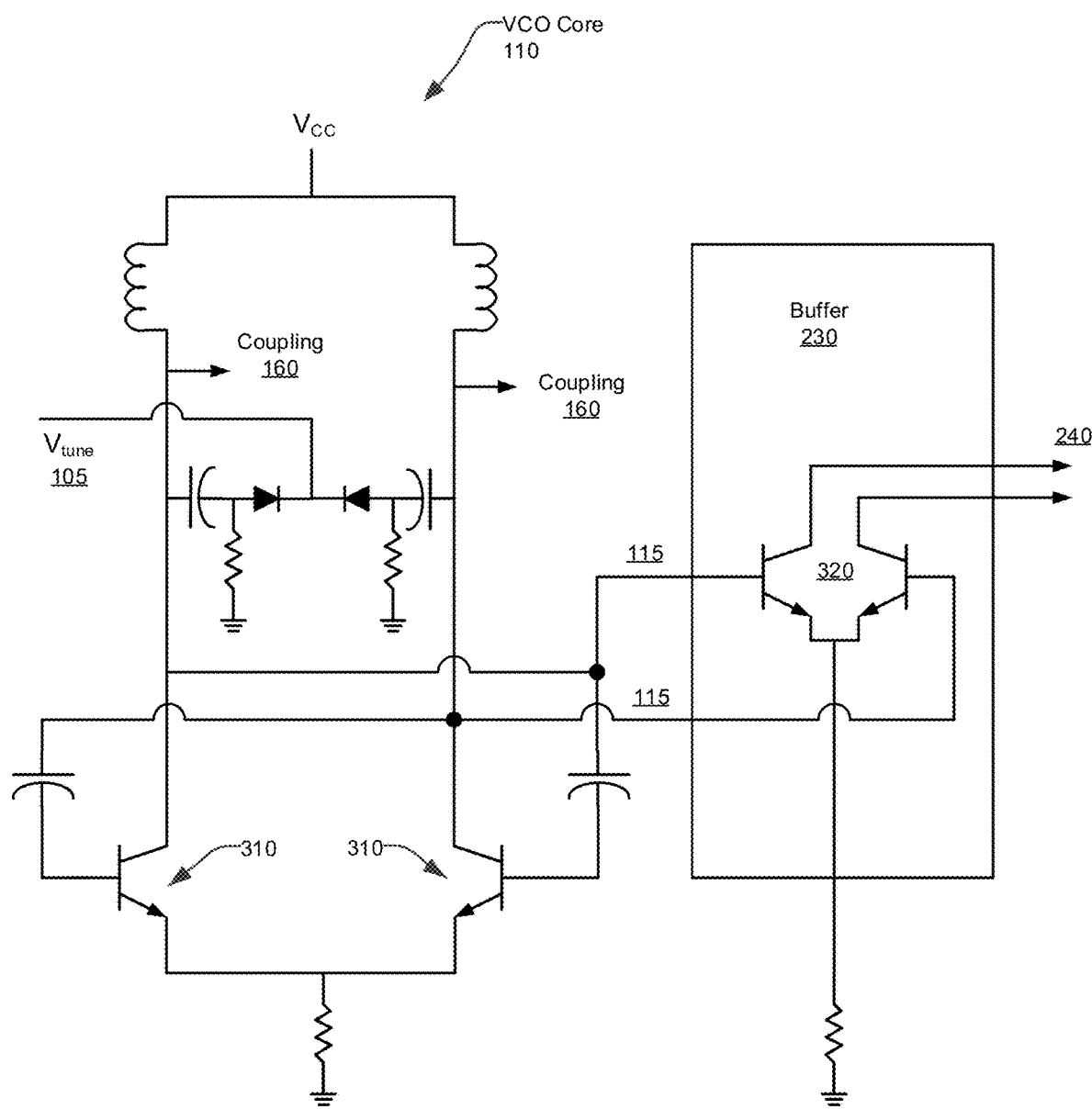
FIG. 3 is a circuit diagram of a VCO core and associated buffer, configured in accordance with certain embodiments of the present disclosure.

FIG. 3 is a circuit diagram 300 of a VCO core and associated buffer, configured in accordance with certain embodiments of the present disclosure. The VCO core 110 is shown in greater detail to include a cross-coupled resonating pair of transistors 310. The buffer circuit 230 is shown in greater detail to include a differential pair of transistors 320. The base of each of the differential pair of transistors 320 of the buffer circuit is coupled to the base of one of the resonating pair of transistors 310 of the VCO core 110 and the collector of the other of the resonating pair of transistors 310 which provides the core generated oscillator signal 115. This configuration provides several advantages including reduced loading on the resonator (which preserves the Q factor of the circuit), and allowing for a smaller signal voltage swing (which eliminates the need for voltage divider techniques). Additionally, this configuration sets the bias voltages to levels that are convenient for controlling tail currents of transistors 320 for MUXless switching, as will be described later. An open collector of each of the differential pair of transistors of the buffer circuit provides the buffered oscillator signal 240, which is shown in this example to be a differential signal. Coupling connection points 160 are also shown to illustrate an embodiment employing direct wiring coupling between VCO cores to achieve synchronous coupling between cores.

Figure 4:
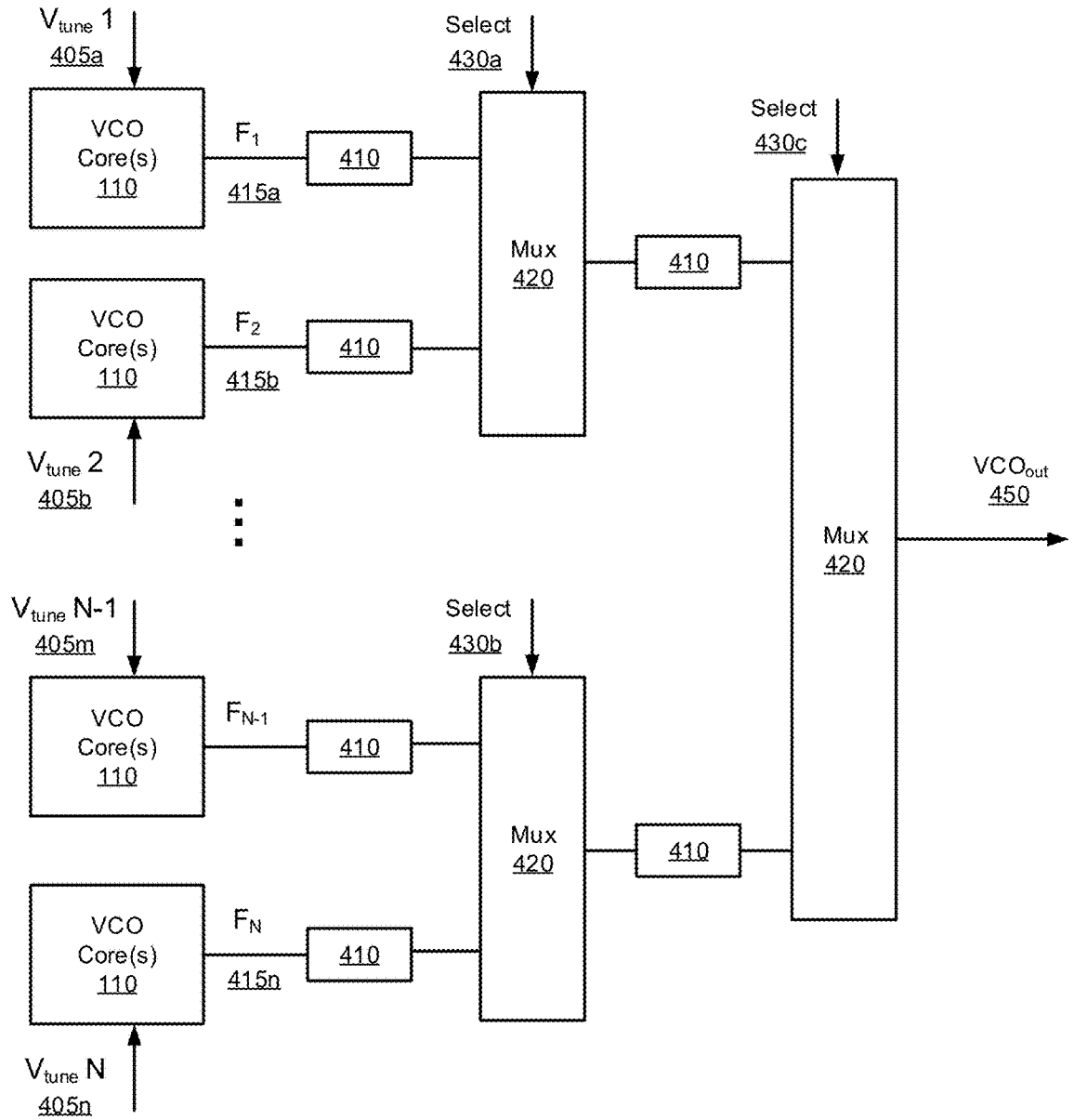
FIG. 4 is a circuit diagram of another VCO configuration susceptible to increased phase noise and the problems that flow therefrom.
Figure 4:
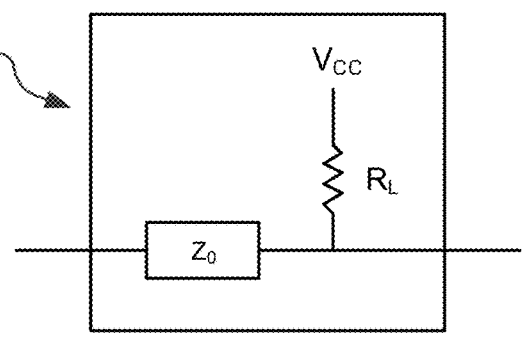

FIG. 4 is a circuit diagram of another VCO configuration 400 susceptible to increased phase noise and the problems that flow therefrom, as will be explained herein. The VCO 400 is shown to include a number of VCO cores 110a, . . . 110n (or groups of synchronously coupled VCO cores as shown in FIG. 1), transmission lines 410, and active multiplexer circuits 420. Each VCO core is configured to generate oscillator signals 415a, . . . 415n, tuned to a selected frequency $F_1, \ldots F_N$, based on Vtune signals 405a, . . . 405n. The selected frequencies $F_1, \ldots F_N$, for each VCO core, are chosen to cover a portion of the broader frequency range that is desired for the VCO 400. The transmission lines 410 couple the VCO cores to the multiplexers. The transmission lines 410 are shown to have a characteristic impedance $Z_0$ and a load resistance termination $R_L$ coupled to a voltage supply source Vcc, which results in power consumption at each coupling. The multiplexer tree structure, as shown, is configured to enable one of the VCO core outputs 415a, . . . 415n to be selected to provide the output signal $VCO_{out}$ 450, based on selection signals 430. Unfortunately, the active circuitry in multiplexers 420 generates undesirable additive phase noise at each stage of the propagation of the selected signal from the VCO core to the output 450. This phase noise, along with the excess power consumption at each transmission line coupling, can cause this type of VCO configuration to be unsuitable for many high-performance applications.

Figure 5:
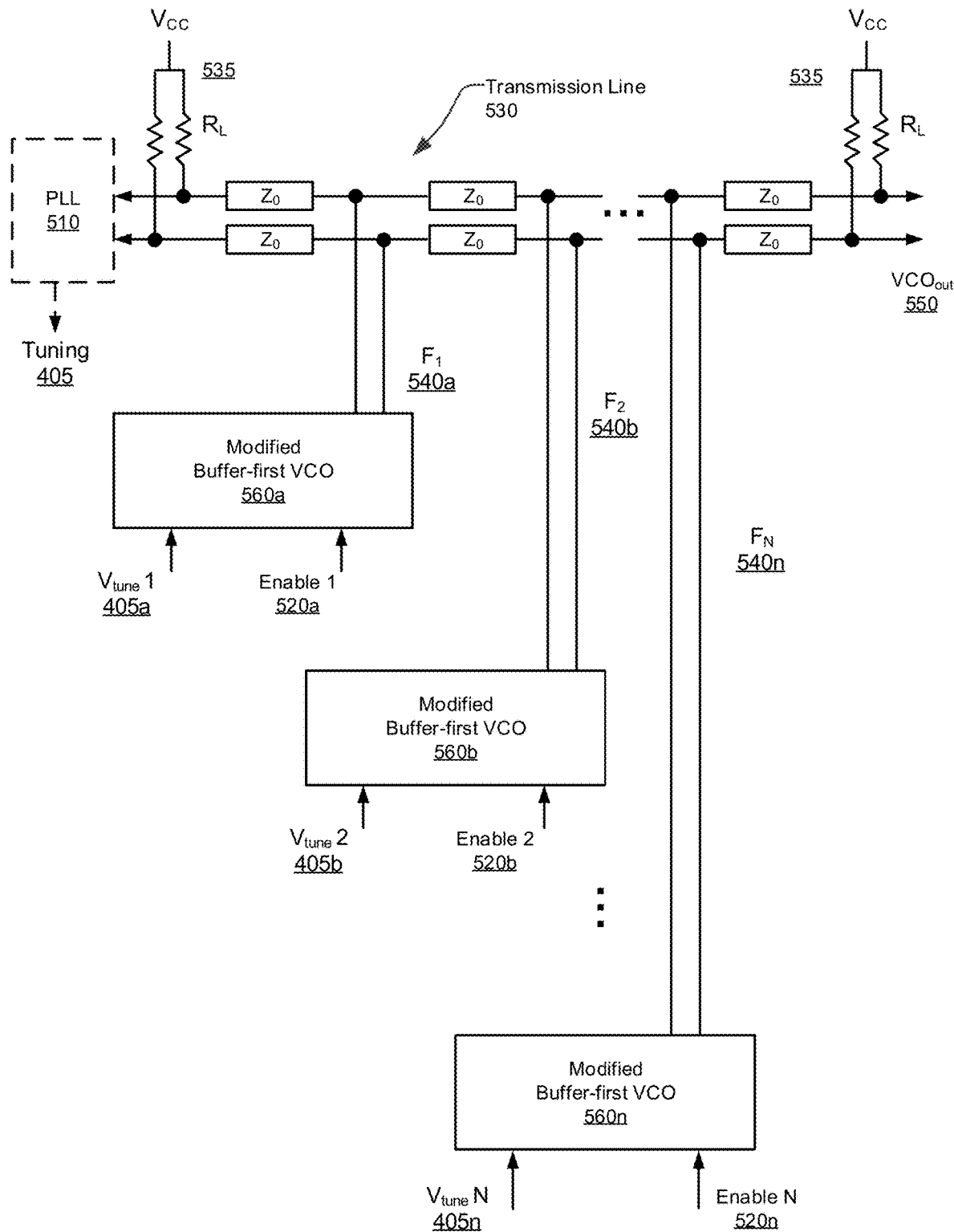
FIG. 5 is a circuit diagram of multiplexer-less (MUXless) VCO, configured in accordance with certain other embodiments of the present disclosure.

FIG. 5 is a circuit diagram of multiplexer-less (MUXless) VCO 500, configured in accordance with certain other embodiments of the present disclosure. The VCO 500 is shown to include a number of modified buffer-first VCOs 560a, ... 560n, a transmission line 530, impedance matching terminations 535 at each end of the transmission line, and an optional a phase locked loop (PLL) circuit 510. Modified buffer-first VCOs 560 are similar to buffer-first VCOs 200, as previously described, with the addition of enable signal circuitry as will be explained in greater detail below.

Modified buffer-first (MBF) VCOs 560 are configured to generate VCO output oscillator signals 540a, ... 540n, tuned to a selected frequency $F_1$, ... FN, based on Vtune signals 405a, ... 405n. The selected frequencies $F_1$, ... $F_N$, for each MBF VCO 560, are chosen to cover a portion of the broader frequency range desired for the MUXless VCO 500. When a particular frequency within that broader frequency range is required to be generated by the MUXless VCO 500, the MBF VCO 560 associated with that particular frequency is selected. Rather than using a tree of multiplexers to select a VCO (as shown previously in FIG. 4), in this disclosed embodiment the MBF VCOs 560 are configured to receive an enable signal 520 to select that MBF VCO to provide the appropriate VCO output oscillator signal 540 to the transmission line 530. No intervening multiplexer circuits are placed in the path between the selected MBF VCO 560 and the signal destination (i.e., consumer of the VCO output). As only one MBF VCO 560 will generally be enabled for coupling to the transmission line at any given time, the additive phase noise from the buffer circuits of the other MBF VCOs is thus reduced or eliminated.

The transmission line 530 is shown to have a characteristic impedance $Z_O$. Additionally, the transmission line is shown to include termination circuitry 535 at each end comprising a load resistance $R_L$ coupled to a voltage supply source Vcc, to provide a matched impedance to the transmission line. In this configuration, there is no need for additional power consuming terminations at each connection point between an MBF VCO 560 and the transmission line 530.

One end of the transmission line 530 provides the VCO output oscillator signal 540 from the selected MBF VCO 560 as the VCO output 550. In some embodiments, this VCO output may be provided to a radio frequency mixer circuit, a millimeter-wave analog-to-digital converter, and a millimeter-wave digital-to-analog converter. In some embodiments, the other end of the transmission line 530 may be coupled to the input of a PLL circuit 510. The PLL circuit is configured to control the tuning voltages 405 based on feedback from the provided input.

Figure 6:
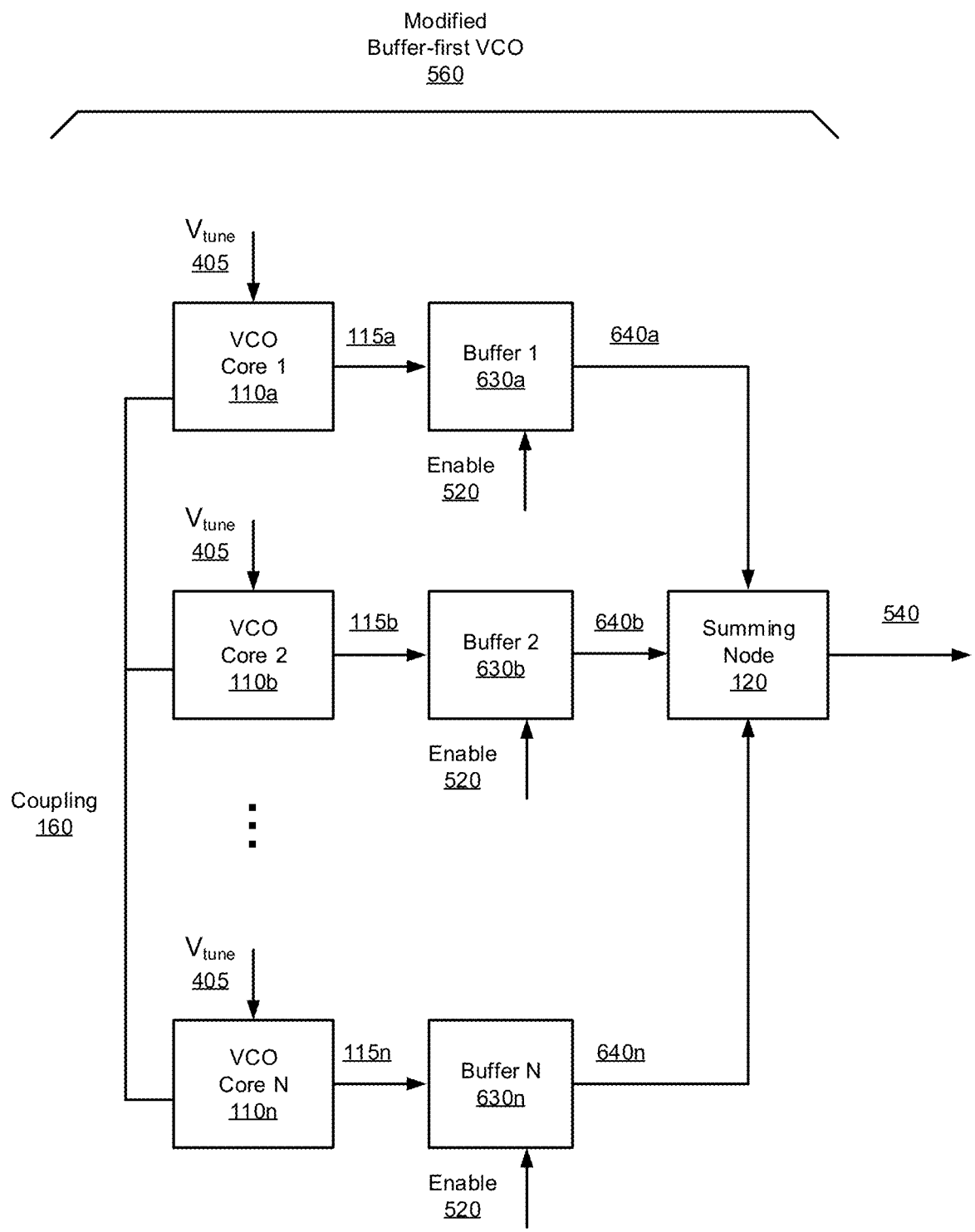
FIG. 6 is a circuit diagram of a modified buffer-first VCO, configured in accordance with certain other embodiments of the present disclosure.

FIG. 6 is a circuit diagram of a modified buffer-first VCO 560, configured in accordance with certain other embodiments of the present disclosure. As mentioned earlier, MBF VCOs 560 are similar to buffer-first VCOs 200 with the addition of enable signal circuitry. In particular, the MBF VCO is shown to include a number of VCO cores 110a, ... 110n, a number of buffer circuits 630a, ... 630n, and a summing node 120.

The VCO cores 110 are shown to be synchronously coupled and tuned to the frequency specified by Vtune signal 405, and are configured to generate oscillator signals 115a, ... 115n at that frequency. The coupling may be accomplished through direct wiring 160, or through electromagnetic coupling, to ensure that all cores are locked to the same frequency and phase. The buffer circuits 630 are coupled to the outputs of the VCO cores 110 and are configured to provide buffered oscillator signals 640a, ... 640n under the control of an enable signal 520, as will be explained in greater detail below. The buffered oscillator signals 640a, ... 640n each include a substantially identical oscillator signal with some level of additional phase noise generated by the buffer circuit. While the oscillator signal component is the same, the phase noise generated by each of the buffer circuits is uncorrelated with the phase noise generated by the other buffer circuits.

The summing node 120 is configured to sum the buffered oscillator signals 640a, ... 640n to generate the VCO output signal 550. This summation increases the strength of the oscillator signal at twice the rate of the uncorrelated noise signal. For every doubling of the number of cores, there is theoretical limit of 3 dB gain in signal to noise ratio. The disclosed technique for buffering before summation allows for the realization of 3 dB per doubling gain at large frequency offsets from the VCO frequency. In contrast, without buffering before summation, the achieved gain will be limited to less than 3 dB per doubling, since all VCO core outputs go through a single buffer which adds corrupting noise to the combined VCO signal. Thus, a reduction in the relative phase noise is achieved in the VCO output 250, using the disclosed techniques.

Figure 7:
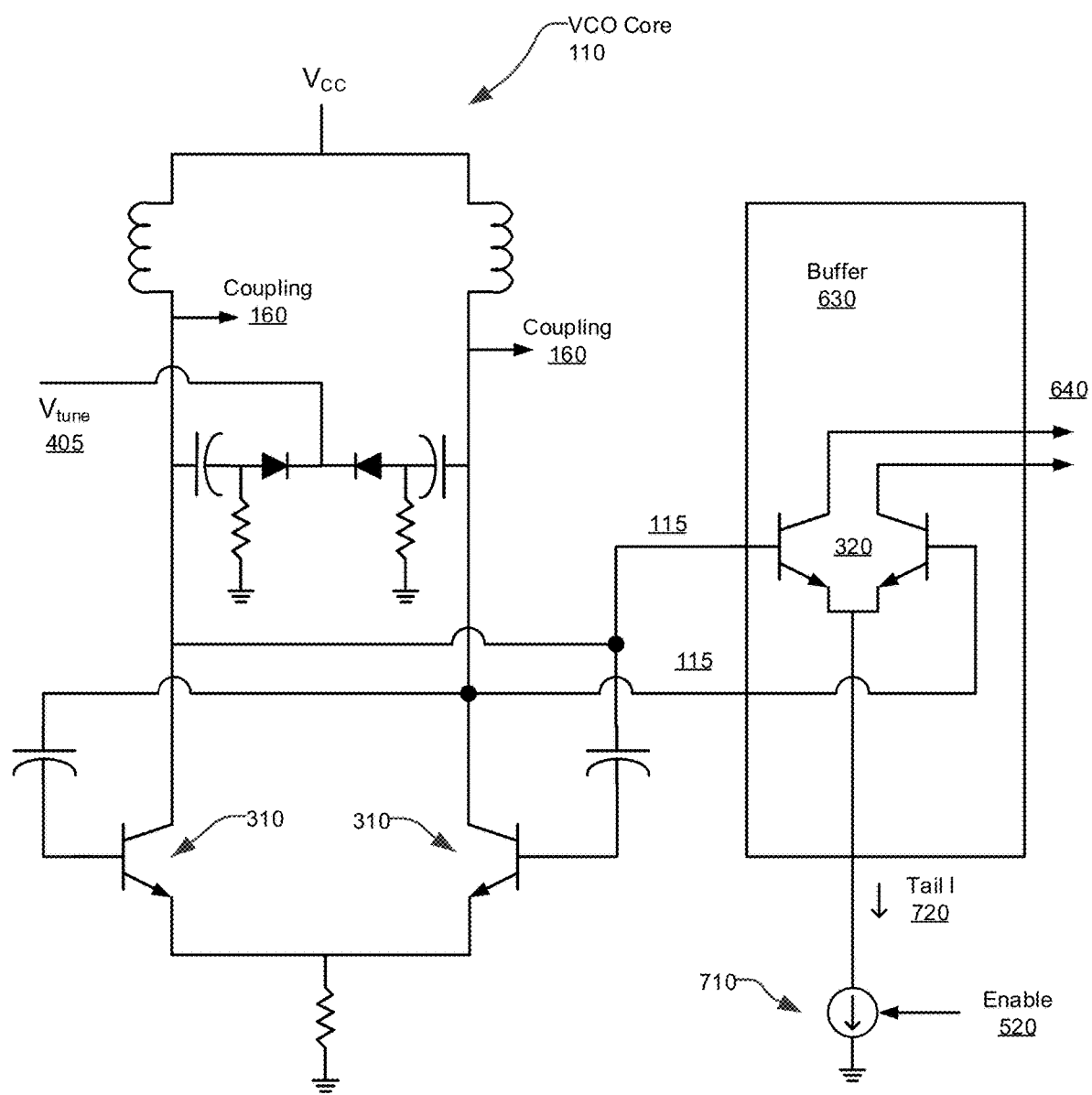
FIG. 7 is a circuit diagram of a VCO core and associated buffer, configured in accordance with certain other embodiments of the present disclosure.

FIG. 7 is a circuit diagram 700 of a VCO core and associated buffer, configured in accordance with certain other embodiments of the present disclosure. The VCO core 110 is shown again to include a cross-coupled resonating pair of transistors 310. The buffer circuit 230 is shown again to include a differential pair of transistors 320. The base of each of the differential pair of transistors 320 of the buffer circuit is coupled to the base of one of the resonating pair of transistors 310 of the VCO core 110 and the collector of the other of the resonating pair of transistors 310 which provides the core generated oscillator signal 115. An open collector of each of the differential pair of transistors of the buffer circuit provides the buffered oscillator signal 640, which is shown in this example to be a differential signal. Coupling connection points 160 are also shown to illustrate an embodiment employing direct wiring coupling between VCO cores to achieve synchronous coupling between cores.

As previously stated, this configuration sets the bias voltages to levels that are convenient for controlling tail currents from the emitters of transistors 320 for MUXless switching, for example through current source 710, and thus eliminates the requirement for voltage divider circuitry to scale the voltage levels. Switched active current source 710 is configured to control the tail current 720, from the emitter of each of the differential pair of transistors 320, based on the enable signal 520. Thus, in response to the activation of enable signal 520, that VCO core is selected to provide the buffered oscillator signal 640 to the transmission line.

Methodology

Figure 8:
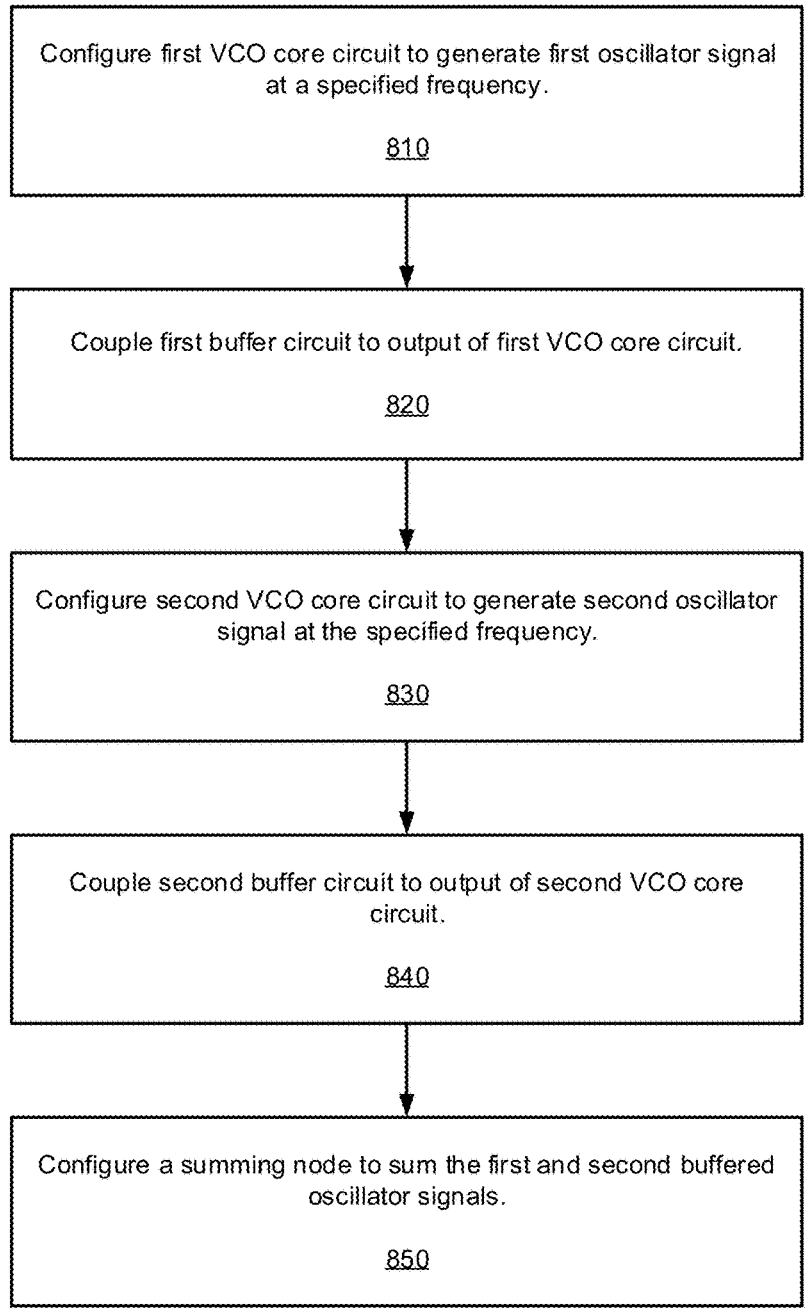
FIG. 8 is a flowchart illustrating a methodology for fabrication of a buffer-first VCO, in accordance with certain embodiments of the present disclosure.

FIG. 8 is a flowchart illustrating a methodology for fabrication of a buffer-first VCO, in accordance with certain embodiments of the present disclosure. As can be seen, example method 800 includes a number of phases and sub-processes, the sequence of which may vary from one embodiment to another. However, when considered in the aggregate, these phases and sub-processes form a fabrication process for a pre-buffered combination of VCOs in accordance with certain of the embodiments disclosed herein. These embodiments can be implemented, for example using the system architecture illustrated in FIGS. 2 and 3, as described above. However other system architectures can be used in other embodiments, as will be apparent in light of this disclosure. To this end, the correlation of the various functions shown in FIG. 8 to the specific components illustrated in FIGS. 2 and 3 is not intended to imply any structural and/or use limitations. Rather other embodiments may include, for example, varying degrees of integration wherein multiple functionalities are effectively performed by one system. Numerous variations and alternative configurations will be apparent in light of this disclosure.

As illustrated in FIG. 8, in one embodiment VCO fabrication method 800 commences by configuring, at operation 810, a first VCO core circuit to generate a first oscillator signal at a frequency specified by a tuning voltage. Next, at operation 820, a first buffer circuit is coupled to an output of the first VCO core circuit to provide a buffered first oscillator signal.

At operation 830, a second VCO core circuit is configured to generate a second oscillator signal at the frequency specified by the tuning voltage, such that the first VCO core circuit and the second VCO core circuit are synchronously tuned and synchronously coupled. At operation 840, a second buffer circuit is coupled to an output of the second VCO core circuit to provide a buffered second oscillator signal, wherein phase noise generated by the first buffer circuit is uncorrelated with phase noise generated by the second buffer circuit.

At operation 850, a summing node is configured to sum the buffered first oscillator signal with the buffered second oscillator signal to generate a VCO output, wherein the summation of the uncorrelated phase noise generated by the first and second buffer circuits provides a reduced phase noise in the VCO output.

Of course, in some embodiments, additional operations may be performed, as previously described in connection with the system. These additional operations may include, for example, configuring the first and second VCO core circuits to include a cross-coupled resonating pair of transistors, and to configure the buffer circuits to include a differential pair of transistors. In some embodiments, the base ports of each of the differential pair of transistors are coupled to the base ports of the corresponding resonating pair of transistors. Additionally, an open collector of each of the differential pair of transistors of the buffer circuits provide the buffered oscillator signals.

Figure 9:
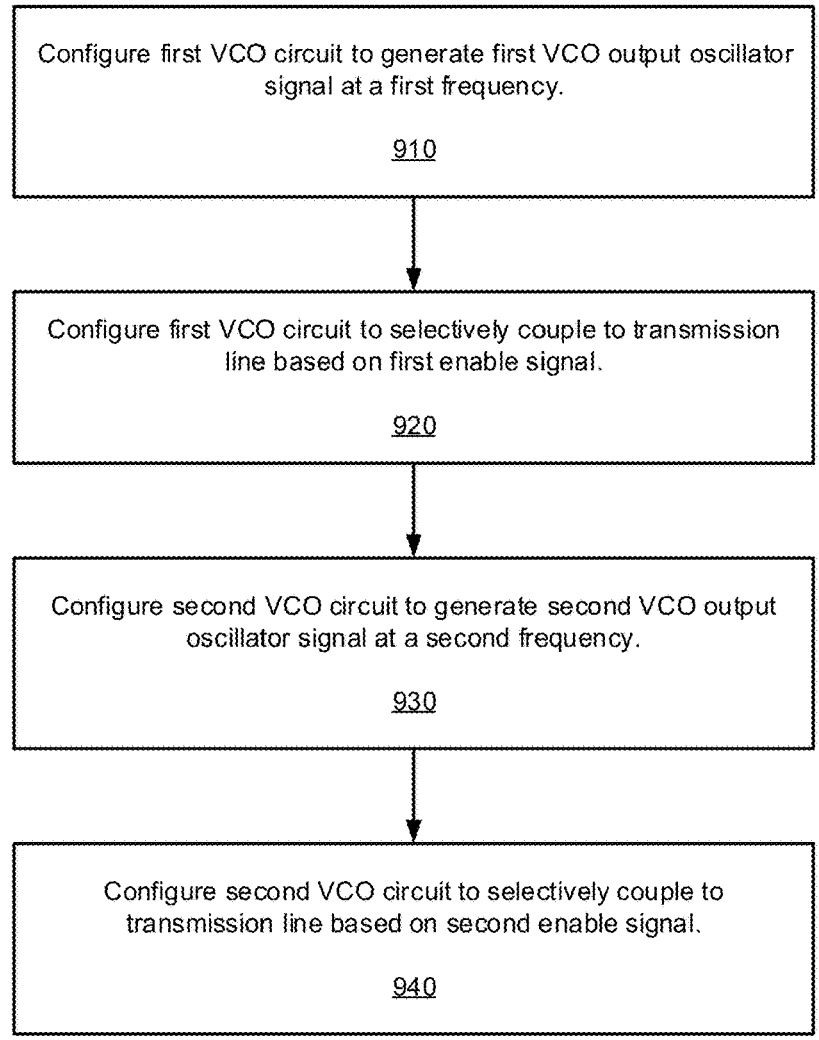
FIG. 9 is a flowchart illustrating a methodology for fabrication of a MUXless VCO, in accordance with certain other embodiments of the present disclosure.

FIG. 9 is a flowchart illustrating a methodology for fabrication of a MUXless VCO, in accordance with certain other embodiments of the present disclosure. As can be seen, example method 900 includes a number of phases and sub-processes, the sequence of which may vary from one embodiment to another. However, when considered in the aggregate, these phases and sub-processes form a fabrication process for a MUXless network of VCOs in accordance with certain of the embodiments disclosed herein. These embodiments can be implemented, for example using the system architecture illustrated in FIGS. 5-7, as described above. However other system architectures can be used in other embodiments, as will be apparent in light of this disclosure. To this end, the correlation of the various functions shown in FIG. 9 to the specific components illustrated in FIGS. 5-7 is not intended to imply any structural and/or use limitations. Rather other embodiments may include, for example, varying degrees of integration wherein multiple functionalities are effectively performed by one system. Numerous variations and alternative configurations will be apparent in light of this disclosure.

As illustrated in FIG. 9, in one embodiment MUXless VCO fabrication method 900 commences by configuring, at operation 910, a first VCO circuit to generate a first VCO output oscillator signal at a first frequency specified by a first tuning voltage. Next, at operation 920, the first VCO circuit is configured to selectively couple to a transmission line in response to a first enable signal provided during a first time period.

At operation 930, a second VCO circuit is configured to generate a second VCO output oscillator signal at a second frequency specified by a second tuning voltage. Next, at operation 940, the second VCO circuit is configured to selectively couple to a transmission line in response to a second enable signal provided during a second time period, wherein the first time period does not overlap with the second time period to reduce additive phase noise to the transmission line.

Of course, in some embodiments, additional operations may be performed, as previously described in connection with the system. These additional operations may include, for example, terminating the ends of the transmission line in a matched impedance and coupling one end of the transmission line to the input of a phase locked loop, for control of the tuning voltages, and coupling the other end of the transmission line to a destination for the VCO. In some embodiments, the first VCO circuit and/or the second VCO circuit are configured as buffer-first VCOs, wherein the buffer is controlled by the enable signal. In some embodiments, the first VCO circuit and/or the second VCO circuit are configured as a single VCO core circuit coupled to a buffer circuit, wherein the buffer circuit is controlled by the enable signal.

Example Platform

Figure 10:
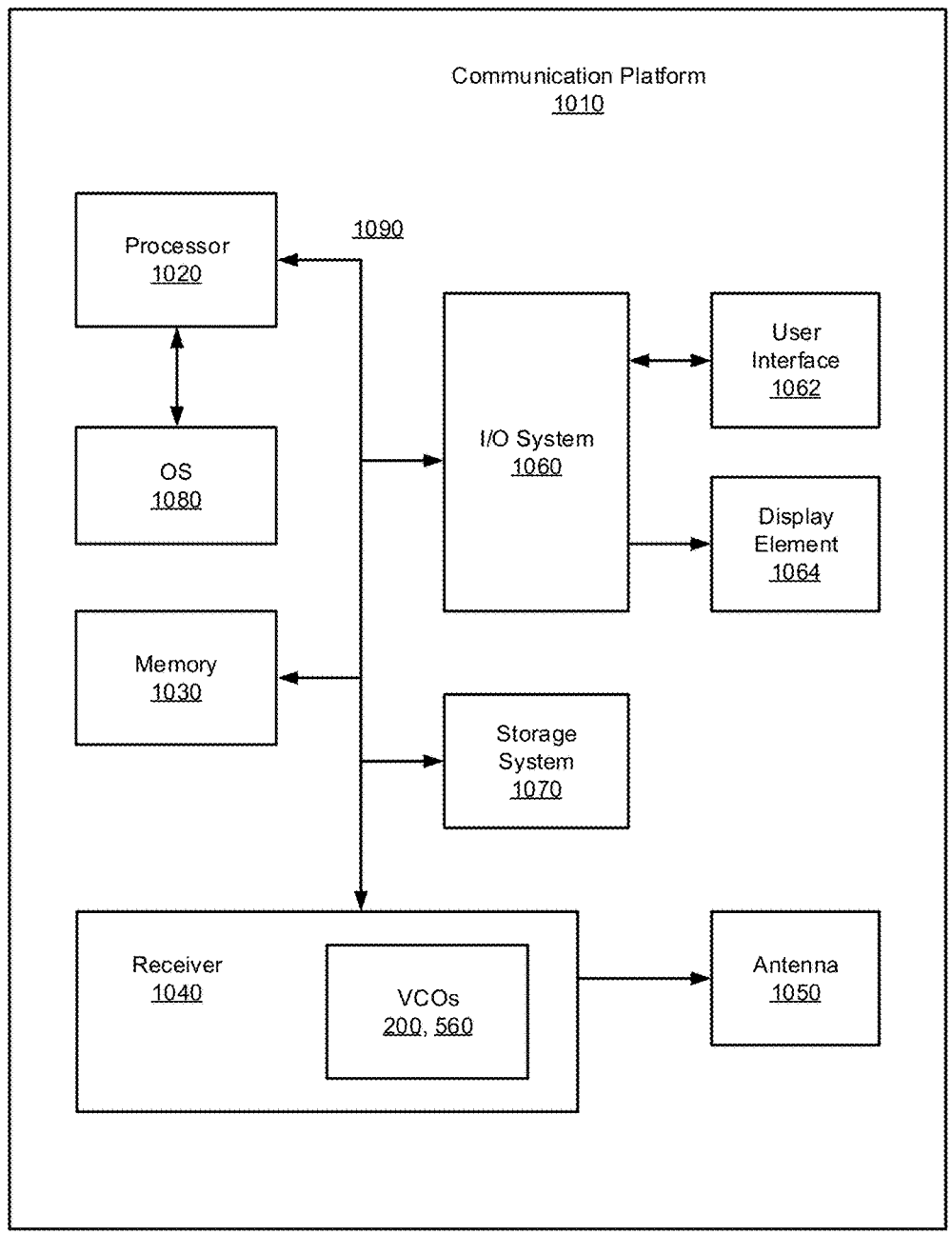
FIG. 10 is a block diagram schematically illustrating a communication platform employing the disclosed reduced phase noise VCOs, in accordance with certain embodiments of the present disclosure.

FIG. 10 is a block diagram 1000 schematically illustrating a communication platform 1010 including a receiver 1040 which employs the disclosed reduced phase noise VCOs 200 and/or 560, in accordance with certain of the embodiments disclosed herein. In some embodiments, communications platform 1010 may be hosted on, or otherwise be incorporated into, a radio, electronic warfare system, microwave backhaul system, data communication device, personal computer, workstation, laptop computer, tablet, portable computer, and so forth. Any combination of different devices may be used in certain embodiments.

In some embodiments, platform 1010 may comprise any combination of a processor 1020, a memory 1030, a receiver 1040 employing VCOs 200, 560, antenna 1050, an input/output (I/O) system 1060, a user interface 1062, a display element 1064, and a storage system 1070. As can be further seen, a bus and/or interconnect 1090 is also provided to allow for communication between the various components listed above and/or other components not shown. Other componentry and functionality not reflected in the block diagram of FIG. 10 will be apparent in light of this disclosure, and it will be appreciated that other embodiments are not limited to any particular hardware configuration.

Processor 1020 can be any suitable processor, and may include one or more coprocessors or controllers, such as an audio processor, a graphics processing unit, or hardware accelerator, to assist in control and processing operations associated with platform 1010. In some embodiments, the processor 1020 may be implemented as any number of processor cores. The processor (or processor cores) may be any type of processor, such as, for example, a microprocessor, an embedded processor, a digital signal processor (DSP), a graphics processor (GPU), a network processor, a field programmable gate array or other device configured to execute code. The processors may be multithreaded cores in that they may include more than one hardware thread context (or "logical processor") per core. Processor 1020 may be implemented as a complex instruction set computer (CISC) or a reduced instruction set computer (RISC) processor.

Memory 1030 can be implemented using any suitable type of digital storage including, for example, flash memory and/or random access memory (RAM). In some embodiments, the memory 1030 may include various layers of memory hierarchy and/or memory caches as are known to those of skill in the art. Memory 1030 may be implemented as a volatile memory device such as, but not limited to, a RAM, dynamic RAM (DRAM), or static RAM (SRAM) device. Storage system 1070 may be implemented as a non-volatile storage device such as, but not limited to, one or more of a hard disk drive (HDD), a solid-state drive (SSD), a universal serial bus (USB) drive, an optical disk drive, tape drive, an internal storage device, an attached storage device, flash memory, battery backed-up synchronous DRAM (SDRAM), and/or a network accessible storage device. In some embodiments, storage 1070 may comprise technology to increase the storage performance enhanced protection for valuable digital media when multiple hard drives are included.

Processor 1020 may be configured to execute an Operating System (OS) 1080 which may comprise any suitable operating system, such as Google Android (Google Inc., Mountain View, Calif.), Microsoft Windows (Microsoft Corp., Redmond, Wash.), Apple OS X (Apple Inc., Cupertino, Calif.), Linux, or a real-time operating system (RTOS). As will be appreciated in light of this disclosure, the techniques provided herein can be implemented without regard to the particular operating system provided in conjunction with platform 1010, and therefore may also be implemented using any suitable existing or subsequently-developed platform.

I/O system 1060 may be configured to interface between various I/O devices and other components of platform 1010. I/O devices may include, but not be limited to, user interface 1062 and display element 1064. User interface 1062 may include other devices (not shown) such as a touchpad, keyboard, mouse, microphone and speaker, trackball or scratch pad, and camera. I/O system 1060 may include a graphics subsystem configured to perform processing of images for rendering on the display element 1064. Graphics subsystem may be a graphics processing unit or a visual processing unit (VPU), for example. An analog or digital interface may be used to communicatively couple graphics subsystem and the display element. For example, the interface may be any of a high definition multimedia interface (HDMI), DisplayPort, wireless HDMI, and/or any other suitable interface using wireless high definition compliant techniques. In some embodiments, the graphics subsystem could be integrated into processor 1020 or any chipset of platform 1010.

It will be appreciated that in some embodiments, the various components of platform 1010 may be combined or integrated in a system-on-a-chip (SoC) architecture. In some embodiments, the components may be hardware components, firmware components, software components or any suitable combination of hardware, firmware or software.

Receiver 1040 is configured to receive signals with desired characteristics through antenna 1050, for example as part of an electronic warfare system, a microwave receiver system, a radio, or other suitable application. In some embodiments, receiver 1040 may be a transceiver configured to both receive and transmit signals through antenna 1050. The signals of interest may be relatively low power signals, and thus it is desirable for receiver 1040 to operate in a low noise manner, employing VCO configurations 200, 560 with reduced phase noise, as previously described. In some embodiments, receiver 1040 may also include RF components such as amplifiers, filters, and the like. VCO configurations 200, 560 may include any or all of the components and features illustrated in FIGS. 2, 3, 5, 6, and 7, as described above.

Various embodiments of platform 1010 may be implemented using hardware elements, software elements, or a combination of both. Examples of hardware elements may include processors, microprocessors, circuits, circuit elements (for example, transistors, resistors, capacitors, inductors, and so forth), integrated circuits, ASICs, programmable logic devices, digital signal processors, FPGAs, logic gates, registers, semiconductor devices, chips, microchips, chipsets, and so forth. Examples of software may include software components, programs, applications, computer programs, application programs, system programs, machine programs, operating system software, middleware, firmware, software modules, routines, subroutines, functions, methods, procedures, software interfaces, application program interfaces, instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power level, heat tolerances, processing cycle budget, input data rates, output data rates, memory resources, data bus speeds, and other design or performance constraints.

Some embodiments may be described using the expression "coupled" and "connected" along with their derivatives. These terms are not intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, but yet still cooperate or interact with each other.

The various embodiments disclosed herein can be implemented in various forms of hardware, software, firmware, and/or special purpose processors. For example, in one embodiment at least one non-transitory computer readable storage medium has instructions encoded thereon that, when executed by one or more processors, cause one or more of the methodologies disclosed herein to be implemented. Other componentry and functionality not reflected in the illustrations will be apparent in light of this disclosure, and it will be appreciated that other embodiments are not limited to any particular hardware or software configuration. Thus, in other embodiments platform 1010 may comprise additional, fewer, or alternative subcomponents as compared to those included in the example embodiment of FIG. 10.

The aforementioned non-transitory computer readable medium may be any suitable medium for storing digital information, such as a hard drive, a server, a flash memory, and/or random access memory (RAM), or a combination of memories. In alternative embodiments, the components and/or modules disclosed herein can be implemented with hardware, including gate level logic such as a field-programmable gate array (FPGA), or alternatively, a purpose-built semiconductor such as an application-specific integrated circuit (ASIC). In some embodiments, the hardware may be modeled or developed using hardware description languages such as, for example Verilog or VHDL. Still other embodiments may be implemented with a microcontroller having a number of input/output ports for receiving and outputting data, and a number of embedded routines for carrying out the various functionalities disclosed herein. It will be apparent that any suitable combination of hardware, software, and firmware can be used, and that other embodiments are not limited to any particular system architecture.

Some embodiments may be implemented, for example, using a machine readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, process, or the like, and may be implemented using any suitable combination of hardware and/or software. The machine readable medium or article may include, for example, any suitable type of memory unit, memory device, memory article, memory medium, storage device, storage article, storage medium, and/or storage unit, such as memory, removable or non-removable media, erasable or non-erasable media, writeable or rewriteable media, digital or analog media, hard disk, floppy disk, compact disk read only memory (CD-ROM), compact disk recordable (CD-R) memory, compact disk rewriteable (CD-RW) memory, optical disk, magnetic media, magneto-optical media, removable memory cards or disks, various types of digital versatile disk (DVD), a tape, a cassette, or the like. The instructions may include any suitable type of code, such as source code, compiled code, interpreted code, executable code, static code, dynamic code, encrypted code, and the like, implemented using any suitable high level, low level, object oriented, visual, compiled, and/or interpreted programming language.

Unless specifically stated otherwise, it may be appreciated that terms such as "processing," "computing," "calculating," "determining," or the like refer to the action and/or process of a computer or computing system, or similar electronic computing device, that manipulates and/or transforms data represented as physical quantities (for example, electronic) within the registers and/or memory units of the computer system into other data similarly represented as physical quantities within the registers, memory units, or other such information storage transmission or displays of the computer system. The embodiments are not limited in this context.

The terms "circuit" or "circuitry," as used in any embodiment herein, are functional and may comprise, for example, singly or in any combination, hardwired circuitry, programmable circuitry such as computer processors comprising one or more individual instruction processing cores, state machine circuitry, and/or firmware that stores instructions executed by programmable circuitry. The circuitry may include a processor and/or controller configured to execute one or more instructions to perform one or more operations described herein. The instructions may be embodied as, for example, an application, software, firmware, or one or more embedded routines configured to cause the circuitry to perform any of the aforementioned operations. Software may be embodied as a software package, code, instructions, instruction sets and/or data recorded on a computer-readable storage device. Software may be embodied or implemented to include any number of processes, and processes, in turn, may be embodied or implemented to include any number of threads or parallel processes in a hierarchical fashion. Firmware may be embodied as code, instructions or instruction sets and/or data that are hard-coded (e.g., nonvolatile) in memory devices. The circuitry may, collectively or individually, be embodied as circuitry that forms part of a larger system, for example, an integrated circuit (IC), an application-specific integrated circuit (ASIC), a system-on-a-chip (SoC), desktop computers, laptop computers, tablet computers, servers, smart phones, and other processor-based or functional systems. Other embodiments may be implemented as software executed by a programmable control device. In such cases, the terms "circuit" or "circuitry" are intended to include a combination of software and hardware such as a programmable control device or a processor capable of executing the software. As described herein, various embodiments may be implemented using hardware elements, software elements, or any combination thereof. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth.

Numerous specific details have been set forth herein to provide a thorough understanding of the embodiments. It will be understood by an ordinarily-skilled artisan, however, that the embodiments may be practiced without these specific details. In other instances, well known operations, components and circuits have not been described in detail so as not to obscure the embodiments. It can be appreciated that the specific structural and functional details disclosed herein may be representative and do not necessarily limit the scope of the embodiments. In addition, although the subject matter has been described in language specific to structural features and/or methodological acts, it is to be understood that the subject matter defined in the appended claims is not necessarily limited to the specific features or acts described herein. Rather, the specific features and acts described herein are disclosed as example forms of implementing the claims.

Further Example Embodiments

The following examples pertain to further embodiments, from which numerous permutations and configurations will be apparent.

One example embodiment of the present disclosure provides a voltage controlled oscillator (VCO) comprising: a first VCO core circuit to generate a first oscillator signal at a frequency specified by a tuning voltage; a first buffer circuit coupled to an output of the first VCO core circuit to provide a buffered first oscillator signal; a second VCO core circuit to generate a second oscillator signal at the frequency specified by the tuning voltage, such that the first VCO core circuit and the second VCO core circuit are synchronously tuned; a second buffer circuit coupled to an output of the second VCO core circuit to provide a buffered second oscillator signal, wherein phase noise generated by the first buffer circuit is uncorrelated with phase noise generated by the second buffer circuit; and a summing node to sum the buffered first oscillator signal with the buffered second oscillator signal to generate a VCO output, wherein the summation of the uncorrelated phase noise generated by the first and second buffer circuits provides a reduced phase noise in the VCO output.

In some cases, the first VCO core circuit and the second VCO core circuit are synchronously coupled. In some cases, the first VCO core circuit and the second VCO core circuit each comprise a cross-coupled resonating pair of transistors. In some such cases, the first buffer circuit and the second buffer circuit each comprise a differential pair of transistors. In some such cases, a base of each of the differential pair of transistors is coupled to a base of a corresponding one of the resonating pair of transistors. In some such cases, an open collector of each of the differential pair of transistors of the first buffer circuit provide the buffered first oscillator signal, and an open collector of each of the differential pair of transistors of the second buffer circuit provide the buffered second oscillator signal. In some cases, the VCO output is a differential signal to drive a transmission line. In some such cases, the transmission line couples the VCO to at least one of a radio frequency mixer circuit, a millimeter-wave analog-to-digital converter, and a millimeter-wave digital-to-analog converter. In some cases, the VCO output is a millimeter-wave signal.

Another example embodiment of the present disclosure provides a multiplexer-less (MUXless) voltage controlled oscillator (VCO) comprising: a first VCO circuit to generate a first VCO output oscillator signal at a first frequency specified by a first tuning voltage, the first VCO circuit selectively coupled to a transmission line in response to a first enable signal provided during a first time period; and a second VCO circuit to generate a second VCO output oscillator signal at a second frequency specified by a second tuning voltage, the second VCO circuit selectively coupled to the transmission line in response to a second enable signal provided during a second time period; wherein the first time period does not overlap with the second time period to reduce additive phase noise applied to the transmission line.

In some cases the, the first VCO circuit comprises: a first VCO core circuit to generate a first instance of an oscillator signal at the first frequency specified by the first tuning voltage; a first buffer circuit coupled to an output of the first VCO core circuit to provide a buffered first instance of the oscillator signal in response to the first enable signal; a second VCO core circuit to generate a second instance of the oscillator signal at the first frequency specified by the first tuning voltage, such that the first VCO core circuit and the second VCO core circuit are synchronously tuned; a second buffer circuit coupled to an output of the second VCO core circuit to provide a buffered second instance of the oscillator signal in response to the first enable signal, wherein phase noise generated by the first buffer circuit is uncorrelated with phase noise generated by the second buffer circuit; and a summing node to sum the buffered first instance of the oscillator signal with the buffered second instance of the oscillator signal to generate the first VCO output oscillator signal, wherein the summation of the uncorrelated phase noise generated by the first and second buffer circuits provides a reduced phase noise in the first VCO output oscillator signal.

In some such cases, the first VCO core circuit and the second VCO core circuit are synchronously coupled. In some cases, a first end of the transmission line is terminated in a matched impedance and a second end of the transmission line is terminated in a matched impedance. In some such cases, the first end of the transmission line is coupled to at least one of a radio frequency mixer circuit, a millimeter-wave analog-to-digital converter, and a millimeter-wave digital-to-analog converter. In some such cases, the second end of the transmission line is coupled to an input of a phased locked loop (PLL) circuit, the PLL circuit to control the first and second tuning voltages. In some such cases, the first VCO core circuit and the second VCO core circuit each comprise a cross-coupled resonating pair of transistors. In some such cases, the first buffer circuit and the second buffer circuit each comprise a differential pair of transistors. In some such cases, a base of each of the differential pair of transistors is coupled to a base of a corresponding one of the resonating pair of transistors. In some such cases, an emitter of each of the differential pair of transistors is coupled to a switched active source controlled by the first enable signal. In some such cases, an open collector of each of the differential pair of transistors of the first buffer circuit couples the buffered first instance of the oscillator signal to the summing node, and an open collector of each of the differential pair of transistors of the second buffer circuit couples the buffered second instance of the oscillator signal to the summing node. In some cases, the first VCO output oscillator signal and the second VCO output oscillator signal are differential signals. In some cases, the first VCO output oscillator signal and the second VCO output oscillator signal are millimeter-wave signals. In some cases, a desired frequency range for the MUXless VCO comprises the first frequency and the second frequency.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner, and may generally include any set of one or more elements as variously disclosed or otherwise demonstrated herein.

What is claimed is:
1. A voltage controlled oscillator (VCO) comprising:
a first VCO core circuit to generate a first oscillator signal at a frequency specified by a tuning voltage;
a first buffer circuit coupled to an output of the first VCO core circuit to provide a buffered first oscillator signal;
a second VCO core circuit to generate a second oscillator signal at the frequency specified by the tuning voltage, such that the first VCO core circuit and the second VCO core circuit are synchronously tuned;
a second buffer circuit coupled to an output of the second VCO core circuit to provide a buffered second oscillator signal, wherein phase noise generated by the first buffer circuit is uncorrelated with phase noise generated by the second buffer circuit; and a summing node to sum the buffered first oscillator signal with the buffered second oscillator signal to generate a VCO output, wherein the summation of the uncorrelated phase noise generated by the first and second buffer circuits provides a reduced phase noise in the VCO output, wherein the first VCO core circuit and the second VCO core circuit each comprise a cross-coupled resonating pair of transistors, and wherein the first buffer circuit and the second buffer circuit each comprise a differential pair of transistors.

2. The VCO of claim 1, wherein the first VCO core circuit and the second VCO core circuit are synchronously coupled.

3. The VCO of claim 1, wherein a base of each of the differential pair of transistors is coupled to a base of a corresponding one of the resonating pair of transistors.

4. The VCO of claim 1, wherein an open collector of each of the differential pair of transistors of the first buffer circuit provide the buffered first oscillator signal, and an open collector of each of the differential pair of transistors of the second buffer circuit provide the buffered second oscillator signal.

5. The VCO of claim 1, wherein the VCO output is a differential signal to drive a transmission line.

6. The VCO of claim 5, wherein the transmission line couples the VCO to at least one of a radio frequency mixer circuit, a millimeter-wave analog-to-digital converter, and a millimeter-wave digital-to-analog converter.

7. The VCO of claim 1, wherein the VCO output is a millimeter-wave signal.

8. A multiplexer-less (MUXless) voltage controlled oscillator (VCO) comprising:
a first VCO circuit to generate a first VCO output oscillator signal at a first frequency specified by a first tuning voltage, the first VCO circuit selectively coupled to a transmission line in response to a first enable signal provided during a first time period; and
a second VCO circuit to generate a second VCO output oscillator signal at a second frequency specified by a second tuning voltage, the second VCO circuit selectively coupled to the transmission line in response to a second enable signal provided during a second time period;
wherein the first time period does not overlap with the second time period to reduce additive phase noise applied to the transmission line; and
wherein the first VCO circuit comprises:
a first VCO core circuit to generate a first instance of an oscillator signal at the first frequency specified by the first tuning voltage;
a first buffer circuit coupled to an output of the first VCO core circuit to provide a buffered first instance of the oscillator signal in response to the first enable signal;
a second VCO core circuit to generate a second instance of the oscillator signal at the first frequency specified by the first tuning voltage, such that the first VCO core circuit and the second VCO core circuit are synchronously tuned;
a second buffer circuit coupled to an output of the second VCO core circuit to provide a buffered second instance of the oscillator signal in response to the first enable signal, wherein phase noise generated by the first buffer circuit is uncorrelated with phase noise generated by the second buffer circuit; and
a summing node to sum the buffered first instance of the oscillator signal with the buffered second instance of the oscillator signal to generate the first VCO output oscillator signal, wherein the summation of the uncorrelated phase noise generated by the first and second buffer circuits provides a reduced phase noise in the first VCO output oscillator signal.

9. The MUXless VCO of claim 8, wherein the first VCO core circuit and the second VCO core circuit are synchronously coupled.

10. The MUXless VCO of claim 8, wherein a first end of the transmission line is terminated in a matched impedance and a second end of the transmission line is terminated in a matched impedance.

11. The MUXless VCO of claim 10, wherein the first end of the transmission line is coupled to at least one of a radio frequency mixer circuit, a millimeter-wave analog-to-digital converter, and a millimeter-wave digital-to-analog converter.

12. The MUXless VCO of claim 10, wherein the second end of the transmission line is coupled to an input of a phased locked loop (PLL) circuit, the PLL circuit to control the first and second tuning voltages.

13. The MUXless VCO of claim 8, wherein the first VCO core circuit and the second VCO core circuit each comprise a cross-coupled resonating pair of transistors.

14. The MUXless VCO of claim 13, wherein the first buffer circuit and the second buffer circuit each comprise a differential pair of transistors.

15. The MUXless VCO of claim 14, wherein a base of each of the differential pair of transistors is coupled to a base of a corresponding one of the resonating pair of transistors.

16. The MUXless VCO of claim 14, wherein an emitter of each of the differential pair of transistors is coupled to a switched active source controlled by the first enable signal.

17. The MUXless VCO of claim 14, wherein an open collector of each of the differential pair of transistors of the first buffer circuit couples the buffered first instance of the oscillator signal to the summing node, and an open collector of each of the differential pair of transistors of the second buffer circuit couples the buffered second instance of the oscillator signal to the summing node.

18. The MUXless VCO of claim 8, wherein the first VCO output oscillator signal and the second VCO output oscillator signal are differential signals.

19. The MUXless VCO of claim 8, wherein the first VCO output oscillator signal and the second VCO output oscillator signal are millimeter-wave signals.

20. The MUXless VCO of claim 8, wherein a desired frequency range for the MUXless VCO comprises the first frequency and the second frequency.

* * * * *